(12) United States Patent
Yang et al.

(10) Patent No.: US 9,418,921 B2
(45) Date of Patent: Aug. 16, 2016

(54) POWER MODULE

(71) Applicant: Industrial Technology Research Institute, Hsinchu (TW)

(72) Inventors: Shu-Jung Yang, Tainan (TW); Yu-Lin Chao, Hsinchu (TW); Heng-Chieh Chien, New Taipei (TW); Chun-Kai Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/965,909

(22) Filed: Dec. 11, 2015

(65) Prior Publication Data

US 2016/0172285 A1    Jun. 16, 2016

Related U.S. Application Data

(63) Continuation-in-part of application No. 14/569,797, filed on Dec. 15, 2014, now Pat. No. 9,240,370.

(51) Int. Cl.
| | |
|---|---|
| *H01L 23/34* | (2006.01) |
| *H01L 23/495* | (2006.01) |
| *H01L 25/18* | (2006.01) |
| *H01L 25/07* | (2006.01) |
| *H01L 23/498* | (2006.01) |

(52) U.S. Cl.
CPC .... *H01L 23/49575* (2013.01); *H01L 23/49562* (2013.01); *H01L 23/49568* (2013.01); *H01L 23/49861* (2013.01); *H01L 25/072* (2013.01); *H01L 25/18* (2013.01)

(58) Field of Classification Search
CPC .................................................. H01L 29/15153
USPC ................................. 257/712–713, 676, 686
See application file for complete search history.

(56) References Cited

U.S. PATENT DOCUMENTS

| | | | |
|---|---|---|---|
| 7,671,465 | B2 | 3/2010 | Funakoshi et al. |
| 8,279,605 | B2 | 10/2012 | Kawanami et al. |
| 8,604,611 | B2 | 12/2013 | Hauenstein |
| 2002/0066947 | A1 | 6/2002 | Yu et al. |

(Continued)

OTHER PUBLICATIONS

Wang et al., "Evaluation of Two-Phase Cold Plate for Cooling Electric Vehicle Power Electronics," Proceedings of the ASME 2011 International Mechanical Engineering Congress & Exposition, Nov. 11-17, 2011, pp. 1-11.

Marz et al., "Power electronics system integration for electric and hybrid vehicles," 2010 6th International Conference on Integrated Power Electronics Systems (CIPS), Mar. 16-18, 2010, pp. 1-10.

(Continued)

*Primary Examiner* — Dung Le
(74) *Attorney, Agent, or Firm* — Jianq Chyun IP Office

(57) ABSTRACT

A power module includes a first substrate, at least two power elements, at least one first conductive structure and at least one leadframe. The first substrate includes a dielectric frame, two first fan-out circuit structure layers and two dielectric plates. The two first fan-out circuit structure layers are respectively disposed on two opposite surfaces of the dielectric frame, the two dielectric plates are respectively disposed on the two first fan-out circuit structure layers, each of the dielectric plates has at least one opening, and the opening and the corresponding first fan-out circuit structure layer form a concavity. The two power elements are respectively embedded in the two concavities. The two power elements are electrically connected to each other through the first conductive structure. The leadframe disposed at the first substrate is electrically connected to the two power elements, and is partially extended outside the first substrate.

20 Claims, 8 Drawing Sheets

(56) References Cited

U.S. PATENT DOCUMENTS

| | | |
|---|---|---|
| 2003/0015782 A1 | 1/2003 | Choi et al. |
| 2009/0218665 A1 | 9/2009 | Yang |
| 2009/0294947 A1* | 12/2009 | Tain .................... H01L 25/0657 |
| | | 257/686 |
| 2010/0295172 A1 | 11/2010 | Gao et al. |
| 2013/0015495 A1 | 1/2013 | Hauenstein |

OTHER PUBLICATIONS

Gillot et al., "Double-sided cooling for high power IGBT modules using flip chip technology," IEEE Transactions on Components and Packaging Technologies, Dec. 2001, pp. 1521-3331.

Byon et al., "Capillary performance of bi-porous sintered metal wicks," International Journal of Heat and Mass Transfer, 2012, pp. 4096-41030.

* cited by examiner

US 9,418,921 B2

POWER MODULE

CROSS-REFERENCE TO RELATED APPLICATION

This application is a continuation-in-part application of and claims the priority benefit of a prior U.S. patent application Ser. No. 14/569,797, filed on Dec. 15, 2014, now U.S. Pat. No. 9,240,370. The entirety of the above-mentioned patent application is hereby incorporated by reference herein and made a part of this specification.

TECHNICAL FIELD

The present invention relates to a power module having embedded power elements.

BACKGROUND

As human populations become concentrated of in cities, people's daily commuting time has gradually increased, and aging of the population has led to prolonged journey time. Therefore, personal mobility vehicles focused on vehicular space, safety and energy-saving have been gradually developed, and industries and research institutes have been actively involved in developments of related technologies.

In designs of the personal mobility vehicles, due to considerations in factors such as vehicular space, weight and operation efficiency, designs in the recent years increasingly integrate a power module and a driver integrated with an electric vehicle motor, so as to reduce the weight and the price and to increase the safety and the efficacy of the personal mobility vehicle via this integrated design. Therefore, how to effectively reduce the volume and the weight of the power module while enabling the power module to have a favorable heat dissipation ability has become a relevant research topic for those skilled in the art of the related field.

SUMMARY

The present invention is directed to a power module with a smaller size and light weight and having a favorable heat dissipation ability.

The power module of the invention includes a first substrate, at least two power elements, at least one first conductive structure and at least one leadframe. The first substrate includes at least one dielectric frame, two first fan-out circuit structure layers and two dielectric plates. The at least one dielectric frame has two opposite surfaces, the two first fan-out circuit structure layers are respectively disposed on the two surfaces, the two dielectric plates are respectively disposed on the two first fan-out circuit structure layers, each of the dielectric plates has at least one opening, and the at least one opening and the corresponding first fan-out circuit structure layer form a concavity. The at least two power elements are respectively disposed on the two first fan-out circuit structure layers, wherein the at least two power elements are respectively embedded in the at least two concavities. The at least two power elements are electrically connected to each other through the first conductive structure. The leadframe is disposed at the first substrate and electrically connected to the two power elements, and is partially extended outside of the first substrate.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a portion of this specification. The drawings illustrate exemplary embodiments and, together with the description, serve to explain the principles of the invention.

DETAILED DESCRIPTION OF DISCLOSED EMBODIMENTS

Figure 1:
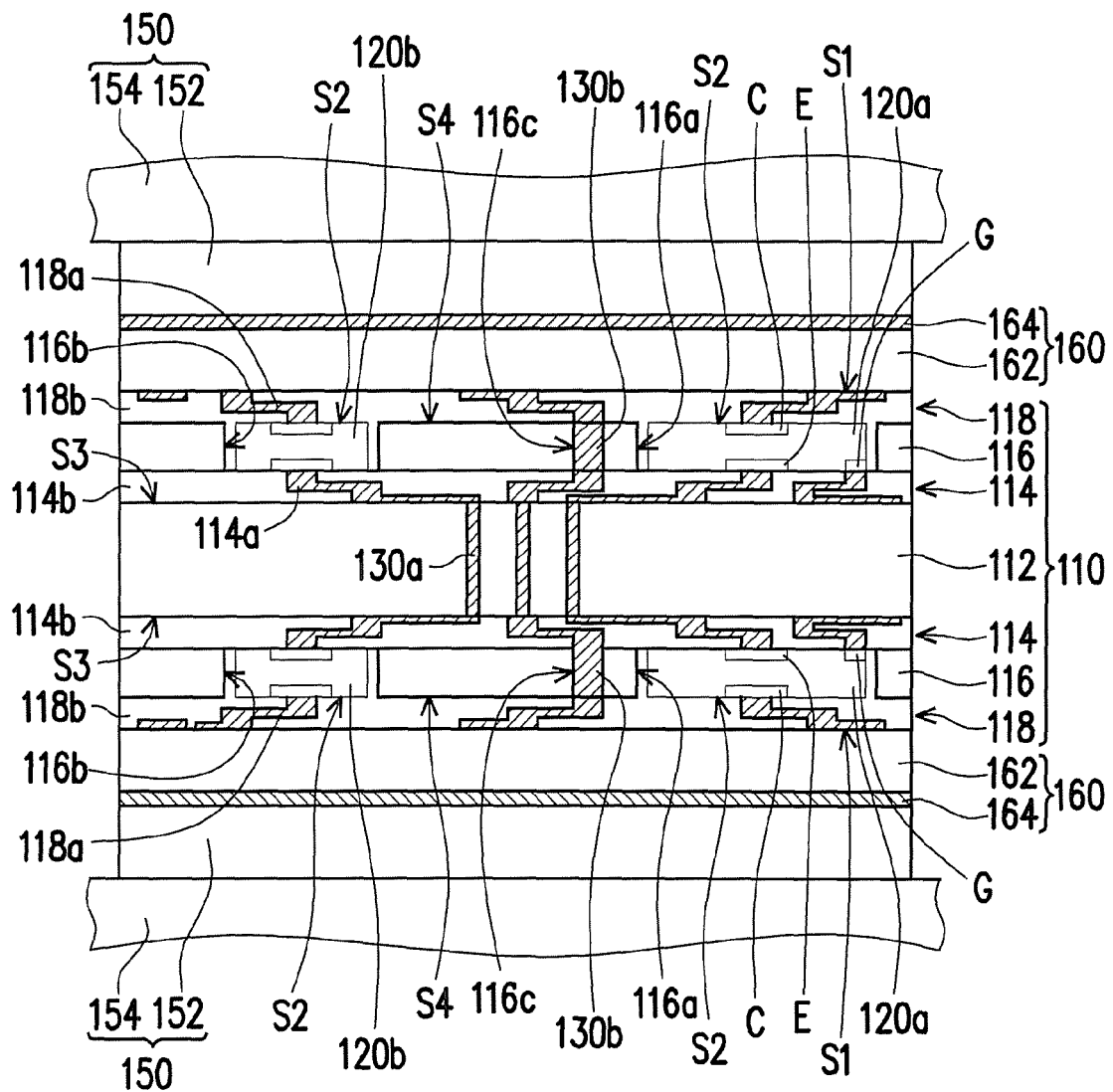
FIG. 1 is a schematic cross-sectional view illustrating a power module according to an embodiment of the invention.
Figure 2:
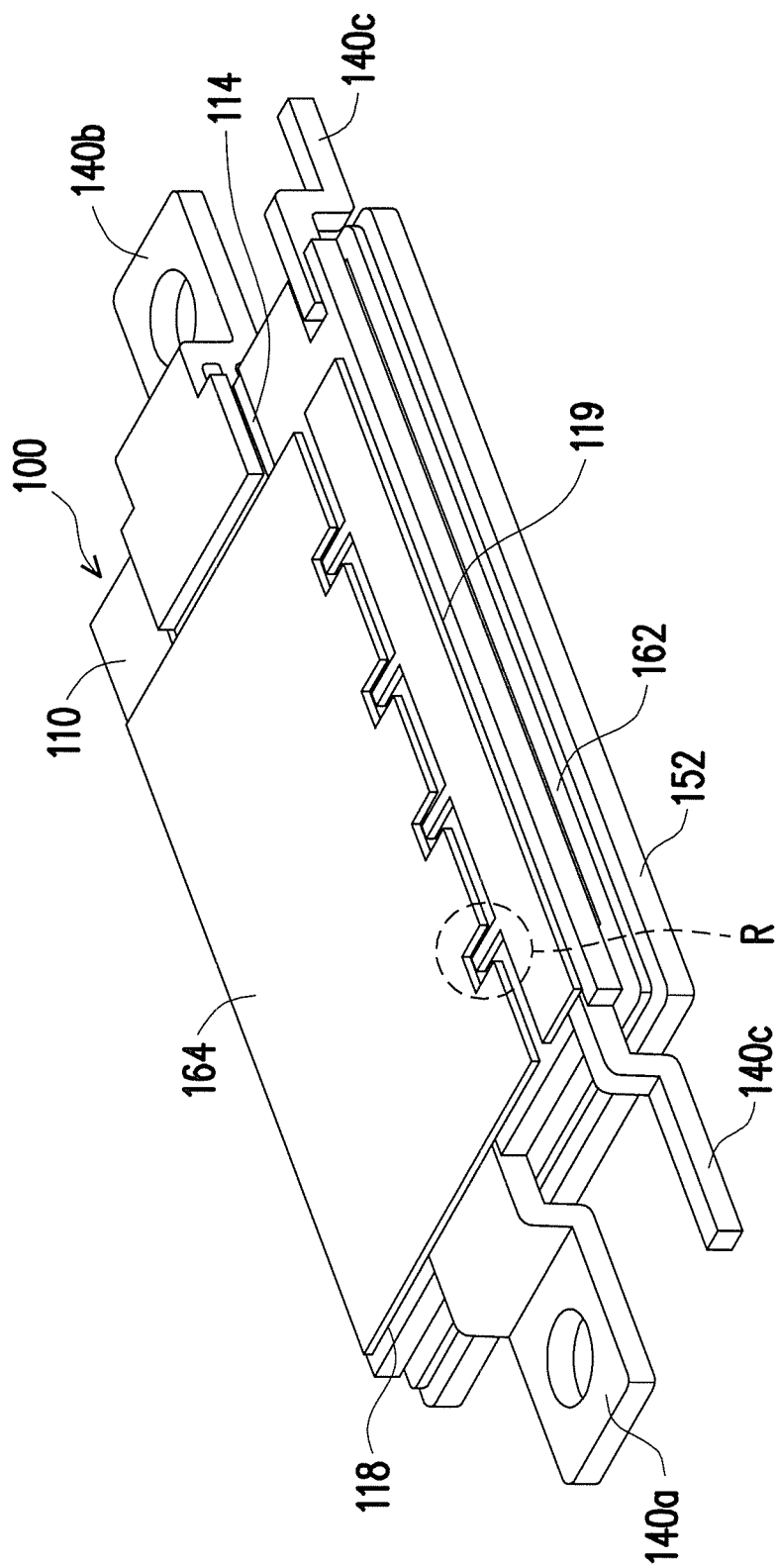
FIG. 2 is a perspective view illustrating some structures of the power module depicted in FIG. 1.

FIG. 1 is a schematic cross-sectional view illustrating a power module according to an embodiment of the invention. FIG. 2 is a perspective view illustrating some structures of the power module depicted in FIG. 1. Referring to FIG. 1 and FIG. 2, a power module 100 of the present embodiment includes a first substrate 110, at least two power elements (illustrated as a plurality of power elements 120a and a plurality of power elements 120b), at least one first conductive structure (illustrated as a plurality of first conductive structures 130a), at least one leadframe (illustrated as a leadframe 140a, a leadframe 140b and two leadframes 140c), and two second substrates 160. The power module 100, for example, is integrated within a power module of a motor of a personal mobility vehicle or other types of power module; the invention is not limited thereto.

The first substrate 110 includes a dielectric frame 112, two first fan-out circuit structure layers 114, and two dielectric plates 116, wherein the dielectric frame 112 and each of the dielectric plates 116, for example, are ceramic layers, and each of the first fan-out circuit structure layers 114, for example, is a redistribution layer (RDL) and includes a plurality of fan-out circuits 114a and an insulating structure 114b overlaying the fan-out circuits 114a.

The dielectric frame 112 has two opposite surfaces S3. The two first fan-out circuit structure layers 114 are respectively disposed on the two surfaces S3 of the dielectric frame 112, each of the dielectric plate 116 has at least one opening (illustrated as an opening 116a and an opening 116b), and the opening 116a/116b and the corresponding first fan-out circuit structure layer 114 form a concavity, wherein a portion of each of the first fan-out circuit structure layers 114 forms a bottom surface of the corresponding concavity, and the concavities are symmetrically formed at two opposite sides of the dielectric frame 112. In other embodiments, the dielectric frame 112 and the two dielectric plate 116 may be made of other suitable materials; the invention is not limited thereto.

The first fan-out circuit structure layers 114 are respectively disposed on the two surfaces S3 of the dielectric frame 112. The first conductive structures 130a are disposed in the dielectric frame 112 and located between the two first fan-out circuit structure layers 114, such that the two first fan-out circuit structure layers 114 are electrically connected to each other through the first conductive structures 130a. The first conductive structures 130a may be conductive vias or a metal conductive members. The power elements 120a and 120b are respectively disposed on the two first fan-out circuit structure layers 114.

The power elements 120a, for example, are insulated gate bipolar transistors (IGBTs) or metal-oxide-semiconductor field effect transistors (MOSFETs), which are respectively embedded in the concavities formed by the opening 116a. The power elements 120b, for example, are corresponded to the diodes of the IGBTs or MOSFETs, which are respectively embedded in the concavities formed by the opening 116b. The power elements 120a are electrically connected to each other through the first fan-out circuit structure layers 114 and the first conductive structures 130a, and the power elements 120b are electrically connected to each other through the first fan-out circuit structure layers 114 and the first conductive structures 130a. The leadframe 140a (as shown in FIG. 2) is disposed at a side of the first substrate 110 and electrically connected to the power elements 120a and the power elements 120b, and is partially extended outside of the first substrate 110. The leadframe 140b (as shown in FIG. 2) is disposed at another side of the first substrate 110 and electrically connected to the power elements 120a and the power elements 120b, and is partially extended outside of the first substrate 110. The leadframes 140c (as shown in FIG. 2) are respectively disposed at the two first fan-out circuit structure layers 114 of the first substrate 110 and electrically connected to the power elements 120a and the power elements 120b, respectively, and are partially extended outside of the first substrate 110. The two second substrates 160 are respectively disposed at two opposite sides of the first substrate 110. In other embodiments, the power elements 120a and 120b may be other proper types of power elements and may be presented in other proper amounts; the invention is not limited thereto.

Under the aforementioned configuration, the power elements 120a and 120b are respectively embedded in the concavities formed by the openings 116a/116b of the dielectric plates 116, and top surfaces S2 of the power elements 120a and 120b can be adjusted at a proper height through filling the height difference between the top surfaces S2 and a top surface S4 of the dielectric plate 116 with insulating material of an insulating structure 118b, thereby solving a problem in structural height difference due to the thicknesses of the power elements being inconsistent. Therefore, unlike the traditional design, the power module 100 is not required to additionally stacking metal spacers on the power elements to solve the problem in structural height difference, so that a volume and a weight of the power module 100 can effectively be reduced and thermal resistance and electrical impedance within the power module 100 can be prevented from increasing due to the power elements being additionally stacked with the metal spacers thereon, thereby enhancing a heat dissipation ability of the power module 100 and lowering a power loss. For instance, in the present embodiment, a thickness of each of the power elements 120a and 120b is designed to be equal to a depth of the corresponding concavity, but the invention is not limited thereto. In other embodiments, the thickness of each of the power elements 120a and 120b may be designed to be smaller to a depth of the corresponding concavity.

The first fan-out circuit structure layers 114, as shown in FIG. 2, are in contact with the leadframe 140b so that, unlike in the traditional design, the leadframe 140b is electrically connected to electrodes at the surfaces S3 (as indicated in FIG. 1) which are connected to the power elements 120a and 120b through the first fan-out circuit structure layers 114 without requiring the use of wire bonding, thereby further reducing the volume of the power module 100.

In addition, since the power elements 120a and 120b of the present embodiment, as described in the above, are embedded in the concavities formed by the openings 116a and 116b rather than directly only disposed on the surface of the fan-out circuit structure layer, offsets to the power elements due to the assembly process between the power elements and the contact pad of the fan-out circuit structure layers can thus be prevented. Moreover, unlike the traditional power module which has only one side of the substrate being disposed with the power elements, in the power module 100 of the present embodiment, the two opposite sides of the first substrate 110 are both being disposed with the power elements 120a and 120b, and thus can increase a concentration degree of the power elements 120a and 120b and reduce an electrical transfer distance between the two power elements 120a and an electrical transfer distance between the two power elements 120b, thereby further reducing the power loss and lowering the parasitic inductance/capacitance.

In the present embodiment, since the two opposite sides of the first substrate 110 are both being disposed with the power elements 120a and 120b, the two opposite sides of the first substrate 110 can both be correspondingly disposed with heat dissipation devices so as to achieve a double side heat dissipation effect, and thereby further enhances the heat dissipation ability of the power module. Referring to FIG. 1, the power module 100 of the present embodiment includes two heat dissipation devices 150, the two heat dissipation devices 150 are respectively disposed at the two opposite sides of the first substrate 110, and one of the second substrates 160 is disposed between the first substrate 110 and one of the heat dissipation devices 150, while the other one of the second substrates 160 is disposed between the first substrate 110 and the other one of the heat dissipation devices 150. Heat generated by the power elements 120a and 120b may be transferred to the two heat dissipation devices 150 through the two second substrates 160.

In detail, each of the first substrates 110 further includes a second fan-out circuit structure layer 118, the first fan-out circuit structure layer 114 and the second fan-out circuit structure layer 118 are respectively disposed on opposite sides of the dielectric plate 116, and the second fan-out circuit structure layer 118, as shown in FIG. 2, is in contact with the leadframe 140a. The second fan-out circuit structure layer 118, for example, is a redistribution layer (RDL) and includes a plurality of fan-out circuits 118a and the insulating structure 118b overlaying the fan-out circuits 118a, wherein the gaps between the power elements 120a/120b and the dielectric plate 116 may be filled with the insulating structure 118b. The first substrates 110, as shown in FIG. 2, further includes a third fan-out circuit structure layer 119, the third fan-out circuit structure layer 119 and the second fan-out circuit structure layers 118 shown in FIG. 2 are disposed at a same side of the dielectric plate 116, and the third fan-out circuit structure layer 119 is in contact with the leadframes 140c. As such, the leadframe 140a and each of the leadframes 140c are attached to and supporting at the second fan-out circuit structure layer 118 and the third fan-out circuit structure layer 119 of the second substrate 160, so as to act as supports and electrical transfer infrastructures for the power module 100. In addition, the power elements 120a and 120b of the present embodiment, other than being electrically connected to the corresponding first fan-out circuit structure layer 114 such as being described in the above, may also be electrically connected to the corresponding second fan-out circuit structure layer 118 and the third fan-out circuit structure layer 119, so as to be electrically connected through a redistribution layer constituted by the second fan-out circuit structure layer 118 and the third fan-out circuit structure layer 119, thereby enabling the leadframes 140a and 140c to electrically connected to the electrodes on the surfaces S1 (as indicated in FIG. 1) which are connected to the power elements 120a and 120b through the second fan-out circuit structure layer 118 and the third fan-out circuit structure layer 119 without requiring the use of wire bonding such as in the traditional design, and thus further reduces the volume of the power module 100. Further, by the fan-out circuit design, the third fan-out circuit structure layer 119 may be indirectly connected to the power elements 120a and 120b through fan-out circuits and does not have to be directly connected to the power elements 120a and 120b, thus the power elements 120a and 120b may not be located under the connection region R illustrated in FIG. 2, and the connection region R may be manufactured with large area, simplifying the manufacturing process and saving cost.

Referring to FIG. 1, each of the dielectric plates 116 may further has at least one through hole 116c, and a second conductive structure 130b is disposed in the through hole 116c, such that each of the first fan-out circuit structure layers 114 and the corresponding second fan-out circuit structure layer 118 could be electrically connected to each other through the second conductive structure 130b. The second conductive structure 130b may be a conductive via or a metal conductive member, and the invention is not limited thereto.

As shown in FIG. 1, each of the heat dissipation devices 150 of the present embodiment includes a thermal spreading structure 152 and a heat dissipation structure 154. The heat dissipation structure 154, for example, is a set of heat dissipation fins, a water-cooling device or other types of heat dissipation structures; the invention is not limited thereto. Each of the second substrates 160 includes a dielectric layer 162 and a metal layer 164, wherein the metal layer 164 and the second fan-out circuit structure layer 118 are disposed on opposite sides of the dielectric layer 162. The thermal spreading structure 152 is disposed between the heat dissipation structure 154 and the second substrate 160 and is bonded with the metal layer 164 of the second substrate 160, so that heat from the power elements 120a and 120b is firstly spread through each of thermal spreading structures 152 then uniformly transferred to the corresponding heat dissipation structure 154 for enhancing a heat dissipated ability of the heat dissipation device 150.

Figure 3:
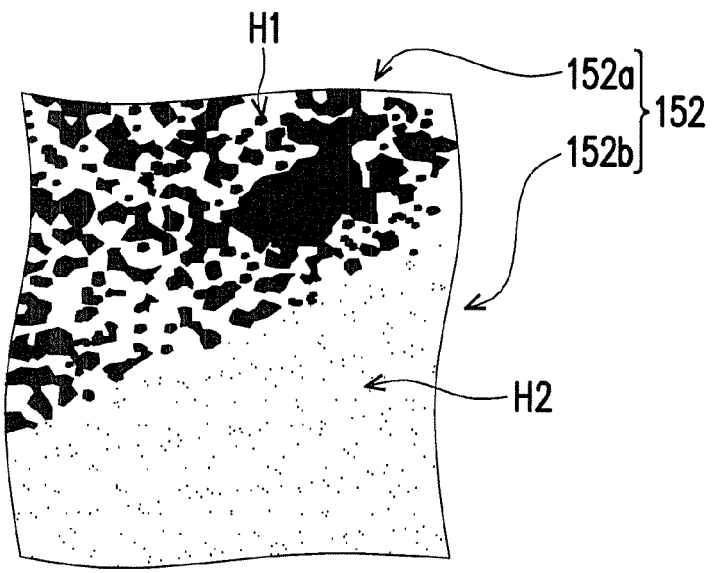
FIG. 3 is a partial enlarged view of a thermal spreading structure depicted in FIG. 1.

FIG. 3 is a partial enlarged view of the thermal spreading structure depicted in FIG. 1. In the present embodiment, each of the thermal spreading structures 152, for example, is a closed vapor chamber constituted by the porous capillary structure and working fluid, and thermally spreads through using vapors circulating within its chamber. As shown in FIG. 3, each of the thermal spreading structures 152 of the present embodiment is a vacuum chamber, and each of the thermal spreading structures 152 includes a first region 152a and a second region 152b. The first region 152a has a plurality of first pores H1, the second region 152b has a plurality of second pores H2, and a pore size of each of the first pores H1 is different from pore size of each of the second pores H2. The porosity of the first pores H1 is not equal to the porosity of the second pores H2. As such, the thermal spreading structure 152 may increase an after condensation reflow rate of the working fluid via the wick structure of the first pores H1 of the first region 152a, and may increase an evaporation rate of the working fluid within the thermal spreading structure 152 via the wick structure of the second pores H2 of the second region 152b, so as to provide each of the thermal spreading structure 152 with a favorable thermal spreading efficiency.

Figure 4:
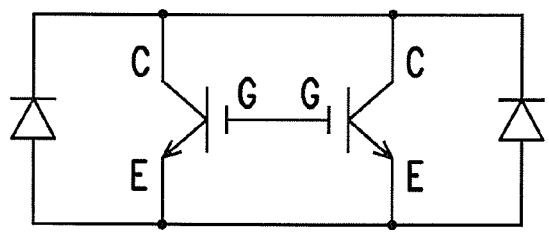
FIG. 4 is a circuit diagram of the power elements depicted in FIG. 1.
Figure 5:
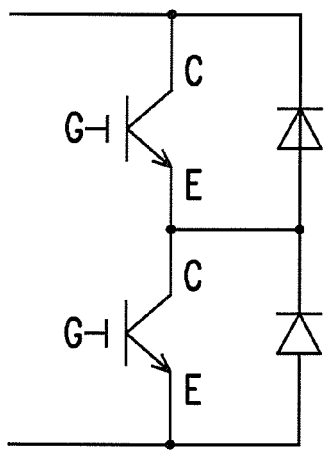
FIG. 5 is a circuit diagram of the power elements according to another embodiment of the invention.

FIG. 4 is a circuit diagram of the power elements depicted in FIG. 1. Referring to FIG. 1 and FIG. 4, each of the two power elements 120a has a collector electrode C, a gate electrode G and an emitter electrode E. The two power elements 120a may be in parallel electrically connected with each other as FIG. 4 illustrating through the two first fan-out circuit structure layers 114 shown in FIG. 1. However, the electrical connection type of the two power elements 120a is not limited in the invention. FIG. 5 is a circuit diagram of the power elements according to another embodiment of the invention. The two power elements 120a may be in series electrically connected with each other as FIG. 5 illustrating through the two first fan-out circuit structure layers 114 shown in FIG. 1.

Figure 6A:
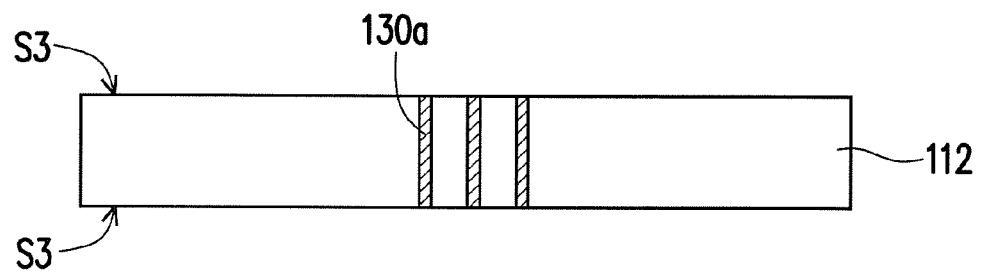
FIG. 6A to FIG. 6F are cross-sectional views schematically illustrating the manufacturing process for the power module depicted in FIG. 1.
Figure 6B:
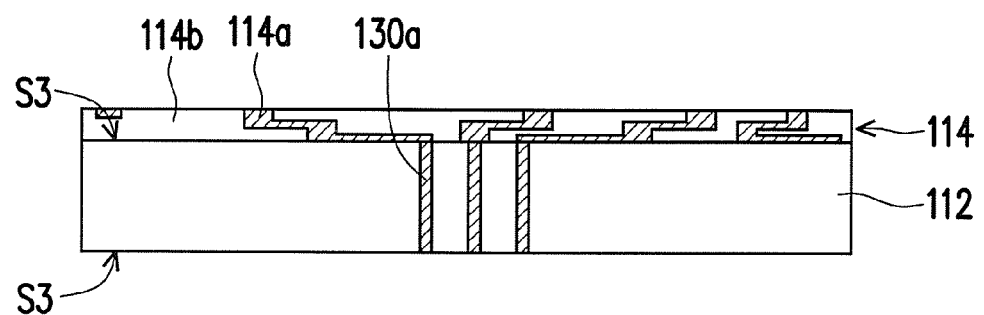
Figure 6C:
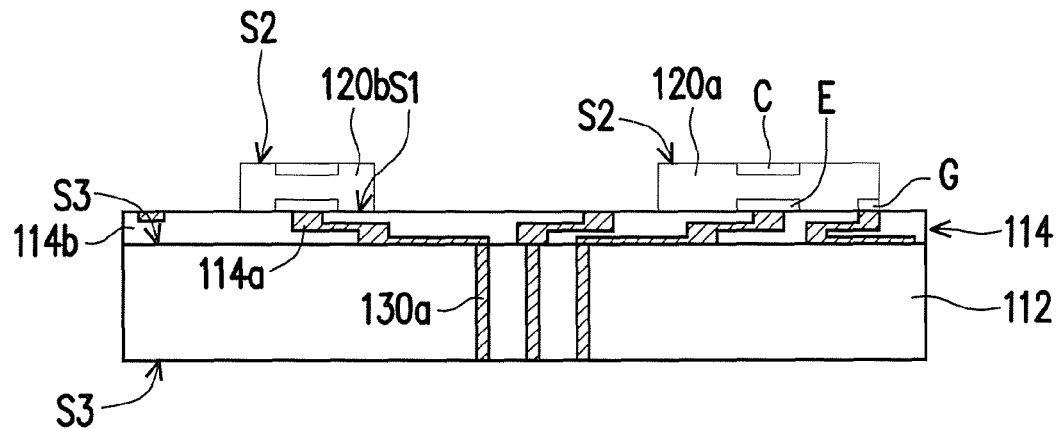
Figure 6D:
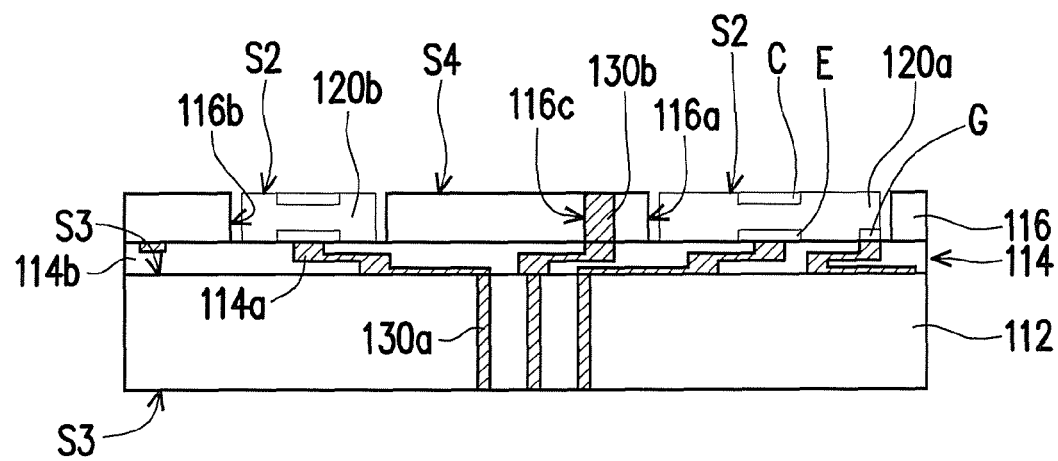
Figure 6E:
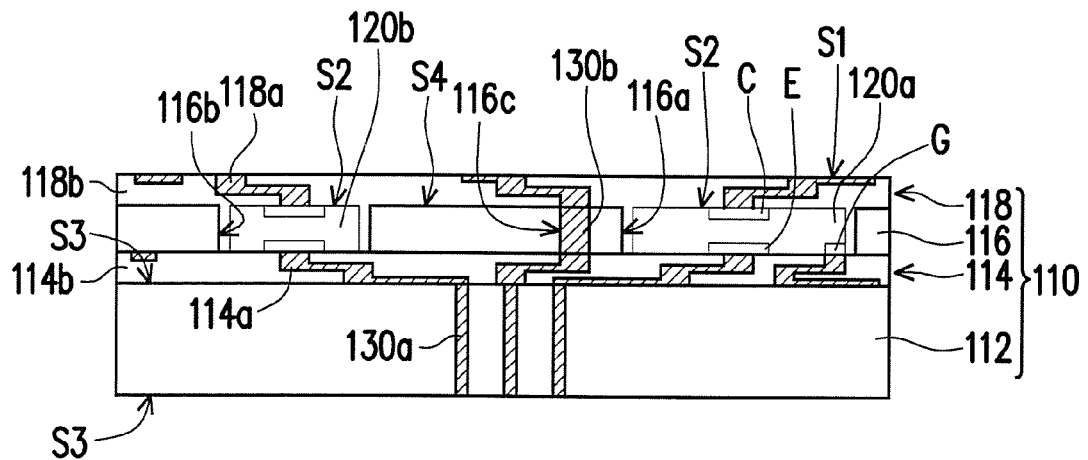

A manufacturing method of the power module 100 is described as follows. FIG. 6A to FIG. 6F are cross-sectional views schematically illustrating the manufacturing process for the power module depicted in FIG. 1. Referring to FIG. 6A, the dielectric frame 112 with the first conductive structures 130a is provided. Referring to FIG. 6B, the first fan-out circuit structure layer 114 is formed on the surface S3 of the dielectric frame 112. Referring to FIG. 6C, the power elements 120a and 120b are formed on the first fan-out circuit structure layer 114. Referring to FIG. 6D, the dielectric plate 116 with the openings 116a and 116b is formed on the first fan-out circuit structure layer 114, such that the power elements 120a and 120b are respectively embedded in the concavities formed by the openings 116a and 116b. Specifically, a copper layer or other kinds of conductive layer may be formed on a side of the dielectric plate 116, for being bonded with the first fan-out circuit structure layer 114, but the invention is not limited thereto. Referring to FIG. 6E, the second fan-out circuit structure layer 118 is formed on the dielectric plate 116 and the power elements 120a and 120b.

Figure 6F:
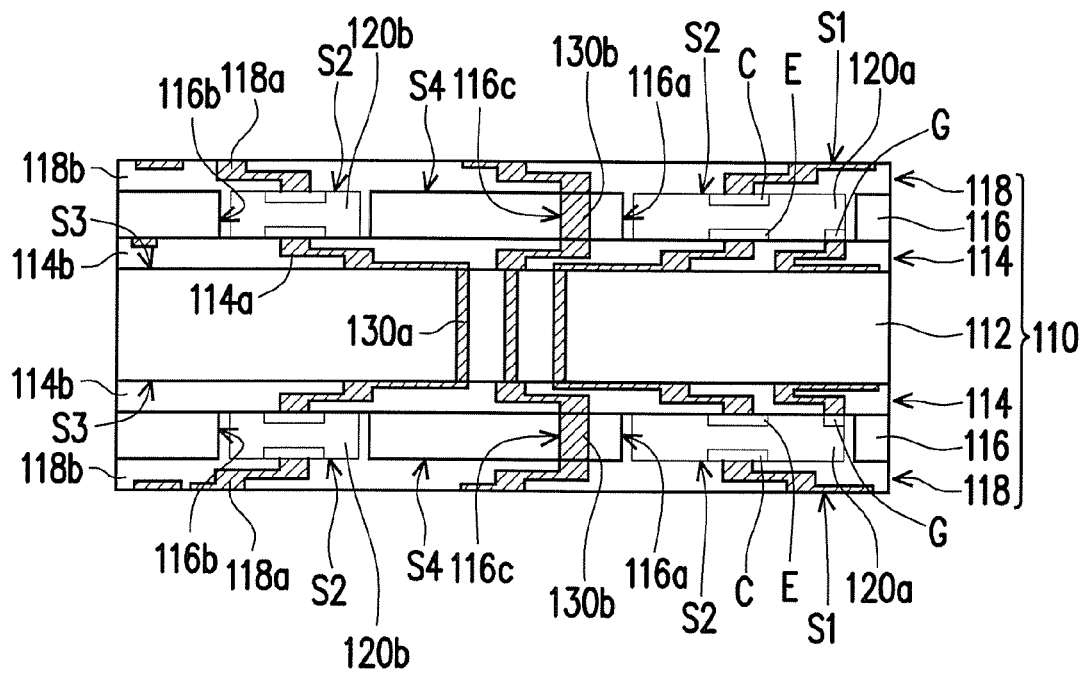

Referring to FIG. 6F, another first fan-out circuit structure layer 114, another power element 120a, another power element 120b, another dielectric plate 116 and another second fan-out circuit structure layer 118 are symmetrically formed on another side of the dielectric frame 112. Then, the dielectric layers 162, the metal layers 164 and the heat dissipation devices 150 may be formed as FIG. 1 illustrating to complete the manufacturing of the power module 100.

In other embodiments, the first fan-out circuit structure layer 114, the corresponding dielectric plate 116, the corresponding power elements 120a and 120b, and the corresponding second fan-out circuit structure layer 118 may be formed as a unit on a temporary base first, and then removed the temporary base to form the unit. Each unit is bonded to the dielectric frame 112 to form the structure illustrated in FIG. 6F, but the invention is not limited thereto.

Figure 7:
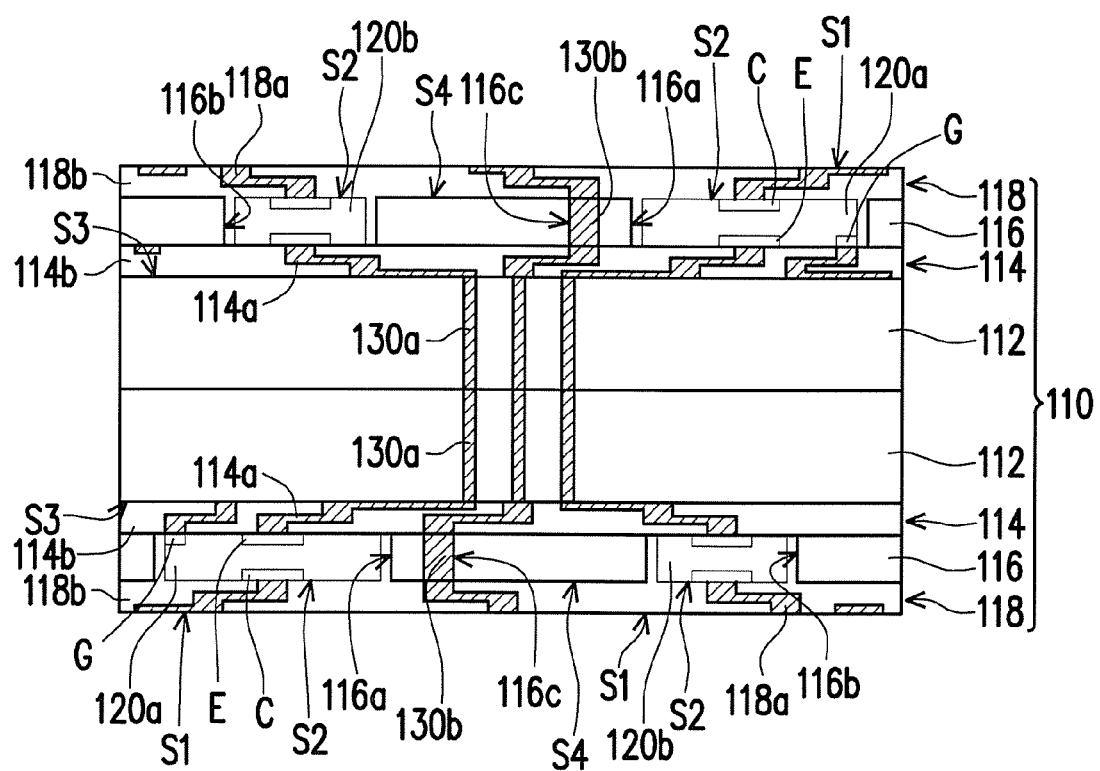
FIG. 7 is a schematic cross-sectional view illustrating partial structures of a power module according to another embodiment of the invention.

FIG. 7 is a schematic cross-sectional view illustrating partial structures of a power module according to another embodiment of the invention. The structure illustrated in FIG. 6E may be bonded to another same one to form the structure illustrated in FIG. 7, which is similar to FIG. 6F. That is, the first substrates 110 in FIG. 7 includes two dielectric frames 112, the two dielectric frames 112 are bonded to each other, and the two first fan-out circuit structure layers 114 are respectively disposed on the two dielectric frames 112.

Figure 8:
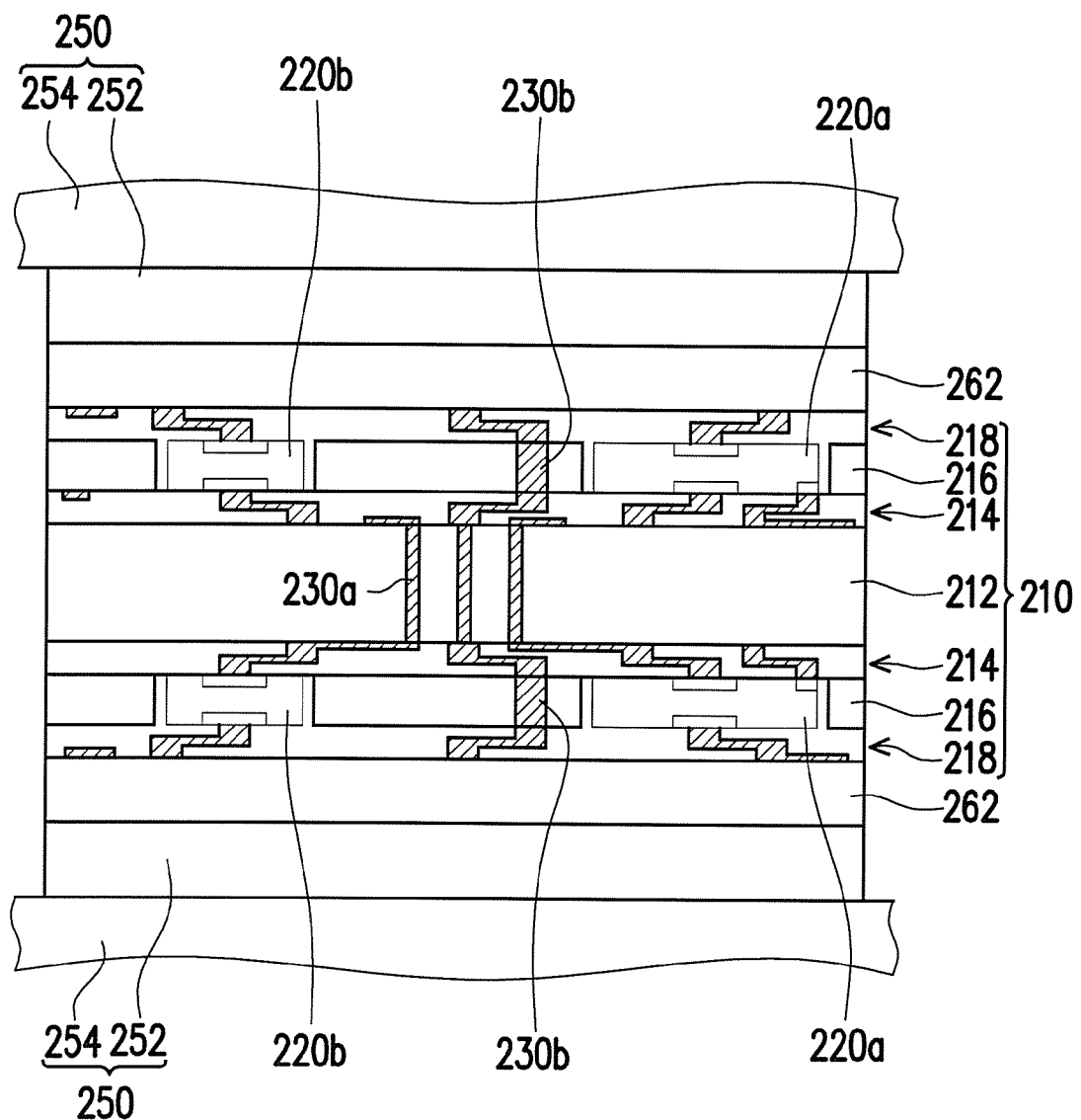
FIG. 8 is a schematic cross-sectional view illustrating a power module according to another embodiment of the invention.

FIG. 8 is a schematic cross-sectional view illustrating a power module according to another embodiment of the invention. In a power module 200 of FIG. 8, configurations and mode of actions of a first substrate 210, a dielectric frame 212, first fan-out circuit structure layers 214, dielectric plates 216, second fan-out circuit structure layers 218, power elements 220*a*, power elements 220*b*, first conductive structures 230*a*, second conductive structures 230*b*, heat dissipation devices 250, thermal spreading structure 252, heat dissipation structures 254, and dielectric layers 262 are similar to that of the configurations and the mode of actions of the first substrate 110, the dielectric frame 112, the first fan-out circuit structure layers 114, dielectric plates 116, the second fan-out circuit structure layers 118, the power elements 120*a*, the power elements 120*b*, first conductive structures 130*a*, second conductive structures 130*b*, the heat dissipation devices 150, the thermal spreading structures 152, the heat dissipation structures 154 and the dielectric layers 162 of FIG. 1, and thus are not to be repeated herein. A difference between the power module 100 and the power module 200 lies in that, in the power module 100, the thermal spreading structure 152 and the dielectric layer 162 are bonded through the metal layer 164 by soldering rather than being integrated as one; whereas in the power module 200, there is no metal layer between the dielectric layer 262 and the thermal spreading structure 252, and the dielectric layer 262 is directly formed on a surface of the thermal spreading structure 252 of the heat dissipation device 250 by pressing, coating and so forth, so that the thermal spreading structure 252 and the dielectric layer 262 is integrated as one, thereby reducing the use of a metal layer and a solder bonding layer, and thus a thermal resistance may further be lowered.

In summary, in the power module of the invention, the power elements are embedded in the concavities formed by the openings of the dielectric plate, and the top surfaces of the power elements can be adjusted at a proper height through filling the height difference between top surfaces of the power elements and a top surface of the dielectric plate with insulating material of the insulating structure, thereby solving the problem in structural height difference due to the thicknesses the of the power elements being inconsistent. As such, unlike the traditional design, the power module is not required to additionally stacking metal spacers on the power elements to solve the problem in structural height difference, and thus the volume and the weight of the power module can effectively be reduced and the thermal resistance and the electrical impedance within the power module can be prevented from increasing due to the power elements being additionally stacked with the metal spacers thereon, thereby enhancing the heat dissipation ability of the power module and lowering the power loss. The power elements of the invention can be electrically connected through the redistribution layer constituted by the first fan-out circuit structure layers on the dielectric frame without requiring the use of wire bonding such as in the traditional design, and thus can further reduce the volume of the power module.

In addition, since the power elements of the invention are embedded in the concavities formed by the openings of the dielectric plates rather than directly only disposed on the surface of the fan-out circuit structure layers, offsets to the power elements due to the assembly process between the power elements and the contact pads of the fan-out circuit structure layers can thus be prevented. Moreover, unlike the traditional power module which has only one side of the substrate being disposed with the power elements, in the power module of the invention, the two opposite sides of the first substrate are both being disposed with the power elements, and thus can increase the concentration degree of the power elements and reduce the electrical transfer distances between the power elements, thereby further reducing the power loss and lowering the parasitic inductance/capacitance. Furthermore, in the invention, since the two opposite sides of the first substrate are both being disposed with the power elements, the two opposite sides of the first substrate can both be correspondingly disposed with the heat dissipation devices so as to achieve the double side heat dissipation effect, and thereby further enhances the heat dissipation of the power module.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A power module, comprising:
    a first substrate, comprising at least one dielectric frame, two first fan-out circuit structure layers, wherein the at least one dielectric frame has two opposite surfaces, the two first fan-out circuit structure layers are respectively disposed on the two surfaces;
    two dielectric plates, the two dielectric plates are respectively disposed on the two first fan-out circuit structure layers, each of the dielectric plates has at least one opening, and the at least one opening and the corresponding first fan-out circuit structure layer form at least one concavity;
    at least two power elements, respectively disposed on the two first fan-out circuit structure layers, wherein the at least two power elements are respectively embedded in each of the at least one concavity of the two dielectric plates;
    at least one first conductive structure, wherein the at least two power elements are electrically connected to each other through the at least one first conductive structure; and
    at least one leadframe, disposed at the first substrate and electrically connected to the at least two power elements, and partially extended outside of the first substrate.

2. The power module as recited in claim 1, wherein each of the fan-out circuit structure layers is in contact with the at least one leadframe.

3. The power module as recited in claim 1, wherein the concavities are symmetrically formed at two opposite sides of the dielectric frame.

4. The power module as recited in claim 1, wherein the at least one first conductive structure is disposed in the dielectric frame and located between the two first fan-out circuit structure layers.

5. The power module as recited in claim 1, wherein the at least one first conductive structure is a conductive via or a metal conductive member.

6. The power module as recited in claim 1, wherein each of the at least two power elements is electrically connected to the corresponding fan-out circuit structure layer.

7. The power module as recited in claim 1, wherein each of the first substrates and dielectric plate comprises a second fan-out circuit structure layer, the first fan-out circuit structure layer and the second fan-out circuit structure layer are respectively disposed on opposite sides of the dielectric plate, and the fan-out circuit structure layer is in contact with the at least one leadframe.

8. The power module as recited in claim 7, wherein each of the at least two power elements is electrically connected to the corresponding fan-out circuit structure layer.

9. The power module as recited in claim 1, comprising two heat dissipation devices, wherein the two heat dissipation devices are respectively disposed at two opposite sides of the first substrate.

10. The power module as recited in claim 9, comprising two second substrates, wherein one of the second substrates is disposed between the first substrate and one of the heat dissipation devices, the other one of the second substrates is disposed between the first substrate and the other one of the heat dissipation devices.

11. The power module as recited in claim 10, wherein each of the second substrates includes a dielectric layer directly connected on the heat dissipation devices.

12. The power module as recited in claim 10, wherein each of the heat dissipation devices comprises a thermal spreading structure and a heat dissipation structure, and the thermal spreading structure is disposed between the heat dissipation structure and the second substrates.

13. The power module as recited in claim 12, wherein each of the second substrates includes a dielectric layer directly formed on a surface of the thermal spreading structure of the heat dissipation device.

14. The power module as recited in claim 12, wherein each of the thermal spreading structure is a vacuum chamber with porous capillary structure and comprises a first region and a second region, the first region has a plurality of first pores communicated with each other, the second region has a plurality of second pores communicated with each other, and an porosity of each of the first pores is not equal to an porosity of each of the second pores.

15. The power module as recited in claim 1, wherein each of the at least two power elements is an insulated gate bipolar transistor (IGBT), a metal-oxide-semiconductor field effect transistor (MOSFET) or a diode.

16. The power module as recited in claim 1, wherein the at least two power elements are in parallel electrically connected with each other through the two first fan-out circuit structure layers.

17. The power module as recited in claim 1, wherein the at least two power elements are in series electrically connected with each other through the two first fan-out circuit structure layers.

18. The power module as recited in claim 1, wherein each of the dielectric plates has at least one through hole, and a second conductive structure is disposed in the through hole.

19. The power module as recited in claim 18, wherein the second conductive structure is a conductive via or a metal conductive member.

20. The power module as recited in claim 1, wherein the at least one dielectric frame comprises two dielectric frames, the two dielectric frames are bonded to each other, the two first fan-out circuit structure layers are respectively disposed on the two dielectric frames.

* * * * *